(12) United States Patent
Kim et al.

(10) Patent No.: US 7,804,323 B2
(45) Date of Patent: Sep. 28, 2010

(54) IMPEDANCE MATCHING CIRCUIT AND SEMICONDUCTOR MEMORY DEVICE WITH THE SAME

(75) Inventors: Ki-Ho Kim, Kyoungki-do (KR); Kee-Teok Park, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/819,796

(22) Filed: Jun. 29, 2007

(65) Prior Publication Data
US 2008/0100334 A1    May 1, 2008

(30) Foreign Application Priority Data
Oct. 31, 2006    (KR) .................... 10-2006-0106128

(51) Int. Cl.
*H03K 17/16* (2006.01)
(52) U.S. Cl. .............................. 326/30; 326/26; 326/87
(58) Field of Classification Search ............... 326/21, 326/26, 30, 81–83, 86–87; 327/108–109
See application file for complete search history.

(56) References Cited

U.S. PATENT DOCUMENTS

| 6,064,224 | A  | * | 5/2000  | Esch et al. ................... 326/30 |
| 6,356,106 | B1 | * | 3/2002  | Greeff et al. ................. 326/30 |
| 6,445,245 | B1 | * | 9/2002  | Schultz et al. ............... 327/541 |
| 6,509,778 | B2 | * | 1/2003  | Braceras et al. ............. 327/308 |
| 6,762,620 | B2 | * | 7/2004  | Jang et al. ................... 326/30 |
| 6,958,613 | B2 |   | 10/2005 | Braun et al. |
| 6,980,020 | B2 |   | 12/2005 | Best et al. |
| 7,068,065 | B1 | * | 6/2006  | Nasrullah ..................... 326/30 |
| 7,151,390 | B2 |   | 12/2006 | Nguyen et al. |
| 7,170,313 | B2 |   | 1/2007  | Shin |

(Continued)

FOREIGN PATENT DOCUMENTS

JP    2005-285125    10/2005

(Continued)

OTHER PUBLICATIONS

Korean Office Action issued in corresponding Korean Patent Application No. 10-2006-0106128, dated on Oct. 30, 2007.

*Primary Examiner*—James H. Cho
*Assistant Examiner*—Christopher Lo
(74) *Attorney, Agent, or Firm*—IP & T Law Firm PLC

(57) ABSTRACT

An impedance matching circuit performs a ZQ calibration for a test on a wafer process of a semiconductor memory device. The impedance matching circuit of the semiconductor memory device includes a first pull-down resistance unit, a first pull-up resistance unit, a second pull-up resistance unit and a second pull-down resistance unit. The first pull-down resistance unit supplies a ground voltage to a first node in response to a calibration test signal. The first pull-up resistance unit calibrates its resistance to that of the first pull-down resistance unit to thereby generate a pull-up calibration code. The second pull-up resistance unit supplies a supply voltage to a second node in response to the pull-up calibration code. The second pull-down resistance unit calibrates its resistance to that of the second pull-up resistance unit to thereby generate a pull-down calibration code.

8 Claims, 4 Drawing Sheets

U.S. PATENT DOCUMENTS

| | | |
|---|---|---|
| 7,176,711 B2 | 2/2007 | Park et al. |
| 7,193,431 B2 * | 3/2007 | Miyake et al. .............. 326/30 |
| 7,268,712 B1 * | 9/2007 | Sheen ..................... 341/120 |
| 7,323,900 B2 * | 1/2008 | Kim ........................ 326/30 |
| 7,446,558 B2 * | 11/2008 | Yuan ....................... 326/30 |

FOREIGN PATENT DOCUMENTS

| | | |
|---|---|---|
| JP | 2006-129423 | 5/2006 |
| KR | 1020030006525 A | 1/2003 |
| KR | 1020030083227 A | 10/2003 |
| KR | 1020040055879 A | 6/2004 |
| KR | 1020070017651 A | 2/2007 |

\* cited by examiner

IMPEDANCE MATCHING CIRCUIT AND SEMICONDUCTOR MEMORY DEVICE WITH THE SAME

CROSS-REFERENCE TO RELATED APPLICATIONS

The present invention claims priority of Korean patent application no. 10-2006-0106128, filed in the Korean Patent Office on Oct. 31, 2006, which is incorporated by reference in its entirety.

BACKGROUND OF THE INVENTION

The present invention relates to an impedance matching circuit in a semiconductor memory device; more particularly, to ZQ calibration performed by the impedance matching circuit.

As an operation speed of electrical products increases, a swing width of signals transmitted between semiconductor memory devices inside the electrical products decreases to minimize a delay time taken to transmit the signals. However, as the swing width decreases, signal transmission is more affected by external noises and signal reflection in an interface terminal would increase by impedance mismatching.

The impedance mismatching is caused by variation of a manufacture process, a supply voltage and an operation temperature (PVT). The impedance mismatching makes it hard to transmit data at a high speed. Because a signal outputted from a semiconductor memory device may be distorted by the impedance mismatching, malfunctions such as a set up/hold fail and misjudgment of the signal level could be caused in a corresponding semiconductor memory device receiving the distorted signal.

A semiconductor memory device includes an input circuit for receiving external signals through an input pad and an output circuit for outputting internal signals through an output pad. Particularly, a semiconductor memory device which is required to operate at a high speed includes an impedance matching circuit for matching interface impedance with a corresponding semiconductor memory device in order to prevent the above malfunctions.

Generally, in a semiconductor memory device transmitting a signal, a source termination is performed by an output circuit. In a semiconductor memory device receiving a signal, a parallel termination is performed by a termination circuit parallelly connected to the input circuit.

ZQ calibration is a process for generating pull-up and pull-down calibration codes which change as conditions of PVT change. A resistance value of input and output circuit is calibrated by using the codes. The ZQ calibration performed in the impedance matching circuit is described below.

FIG. 1 is a block diagram illustrating a conventional impedance matching circuit. The impedance matching circuit includes a first pull-up resistor PU1, a second pull-up resistor PU2, a pull-down resistor PD, a reference voltage generator 103, comparators 104 and 107 and counters 105 and 108.

When the first pull-up resistor PU1 is coupled to an external resistor 101 through a pad ZQ, a voltage is generated at a first node 102. The external resistor 101 generally has resistance of 240Ω. The comparator 104 compares the voltage at the first node 102 with a reference voltage VREF outputted from the reference voltage generator 103, to thereby generate an up/down signal UP/DOWN. The reference voltage VREF is generally set to a half of supply voltage VDDQ/2.

The counter 105 receives the up/down signal UP/DOWN to thereby generate a binary code PCODE<0:N>. The binary code PCODE<0:N> turns on/off MOS transistors coupled in parallel in the first pull-up resistor PU1, to thereby calibrate resistance. The calibrated resistance of the first pull-up resistor PU1 has an effect on the voltage at the first node 102. Above operations are repeated. That is, calibration, i.e., pull-up calibration, is performed in the first pull-up resistor PU1 in order for the resistance of the first pull-up resistor PU1 to become identical to the resistance of the external resistor 101.

The binary code PCODE<0:N> is also inputted into the second pull-up resistor PU2 and determines resistance of the second pull-up resistor PU2. Similarly with the pull-up calibration, a pull-down calibration is performed. A voltage at a second node 106 becomes identical to the reference voltage VREF by a binary code NCODE<0:N> generated by the comparator 107 and the counter 108. The pull-down calibration is performed in order for resistance of the pull-down resistor PD to become identical to the resistance of the second pull-up resistor PU2.

The ZQ calibration includes the pull-up calibration and the pull-down calibration. The binary codes PCODE<0:N> and NCODE<0:N> resulting from the ZQ calibration are inputted to input or output circuits and calibrate their resistance to an external resistance.

FIG. 2 is a graph depicting a voltage level changed by the calibration. As a predetermined period elapses, the voltages at the first and second node 102 and 106 converge on the level of the reference voltage.

As described above, the conventional impedance matching circuit performs the pull-up calibration in order for the external resistor 101 to have identical resistance with the first pull-up resistor PU1, and performs the pull-down calibration in order for the second pull-up resistor PU2 to have identical resistance with the pull-down resistor PD.

Accordingly, on condition that the external resistor 101 is connected through the pad ZQ, it is possible that the impedance matching circuit performs the calibration. After connecting the external resistor 101 with a semiconductor memory device packaged in advance, a test for checking the calibration operation can be performed. In a semiconductor memory device processes such as a wafer process, prior to a packaging process, the calibration operation cannot be tested.

SUMMARY OF THE INVENTION

Embodiments of the present invention are directed to providing an impedance matching circuit which performs ZQ calibration for a test on a wafer process of a semiconductor memory device and a method for testing the ZQ calibration.

In accordance with an aspect of the present invention, an impedance matching circuit of a semiconductor memory device includes a first pull-down resistance unit for supplying a ground voltage to a first node in response to a calibration test signal, a first pull-up resistance unit for calibrating its resistance to that of the first pull-down resistance unit to thereby generate a pull-up calibration code, a second pull-up resistance unit for supplying a supply voltage to a second node in response to the pull-up calibration code, and a second pull-down resistance unit for calibrating its resistance to that of the second pull-up resistance unit to thereby generate a pull-down calibration code.

In accordance with an another aspect of the present invention, an impedance matching circuit of a semiconductor memory device includes an input unit for receiving a test calibration code, a first pull-down resistance unit for supplying a ground voltage to a first node and having resistance determined according to the test calibration code, a first pull-up resistance unit for supplying a supply voltage to the first node and for calibrating its resistance to that of the first pull-down resistance unit to thereby generate a pull-up calibration code, a second pull-up resistance unit for supplying the supply voltage to a second node in response to the pull-up calibration code, and a second pull-down resistance unit for supplying the ground voltage to the second node for calibrating its resistance to that of the second pull-up resistance unit to thereby generate a pull-down calibration code.

In accordance with a third aspect of the present invention, a method for testing a ZQ calibration impedance matching circuit includes activating a first pull-down resistance unit in response to a calibration test signal, generating a pull-up calibration code by calibrating resistance of a first pull-up resistance unit to that of the first pull-down resistance unit, inputting the pull-up calibration code to a second pull-up resistance unit, generating a pull-down calibration code by calibrating resistance of a second pull-down resistance unit to that of the second pull-up resistance unit, and outputting the pull-down calibration code.

In accordance with a fourth aspect of the present invention, a method for testing a ZQ calibration includes determining resistance of a first pull-down resistance unit by inputting a test calibration code, generating a pull-up calibration code by calibrating resistance of a first pull-up resistance unit to that of the first pull-down resistance unit, inputting the pull-up calibration code to a second pull-up resistance unit, generating a pull-down calibration code by calibrating resistance of a second pull-down resistance unit to that of the second pull-up resistance unit, and outputting the pull-down calibration code.

In accordance with a fifth aspect of the present invention, a semiconductor memory device capable of testing a calibration operation on a wafer process includes a pad to be connected to a standard resistance generated by the calibration operation, and a pull-down resistance unit connected to the pad for supplying a ground voltage to the pad and being turned on/off in response to a test calibration code.

In accordance with a fifth aspect of the present invention, an impedance matching circuit of a semiconductor memory device includes a test resistance unit coupled with a first node for receiving a calibration test signal, a first resistance unit coupled with the first node for calibrating its resistance to that of the test resistance unit in response to a calibration code, and a calibration code generator for generating the calibration code by comparing a reference voltage level with a voltage level of the first node.

DESCRIPTION OF SPECIFIC EMBODIMENTS

An impedance matching circuit of a semiconductor memory device which is able to test a ZQ calibration operation on a wafer process includes a first pull-down resistor operating as an external resistor, i.e., a standard resistor of the calibration. Accordingly, it is possible to test the ZQ calibration operation without connecting an external resistor to a semiconductor memory device packaged in advance. The semiconductor memory device is also able to test the ZQ calibration operation in response to a variety of standard resistance by further including an input unit receiving a test calibration code.

Hereinafter, an impedance matching circuit in accordance with the present invention will be described in detail referring to the accompanying drawings.

Figure 1:
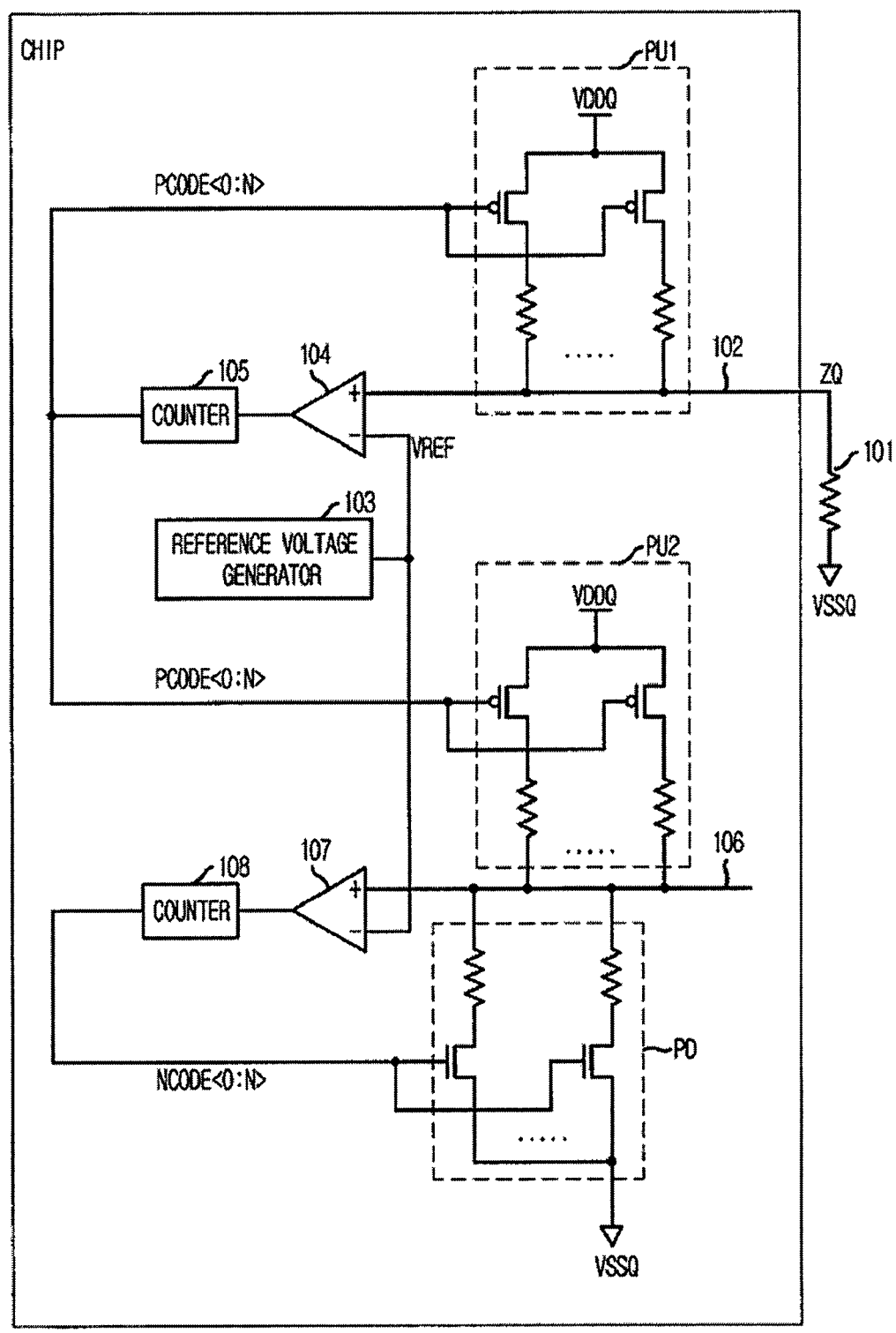
FIG. 1 is a block diagram illustrating a conventional impedance matching circuit.
Figure 2:
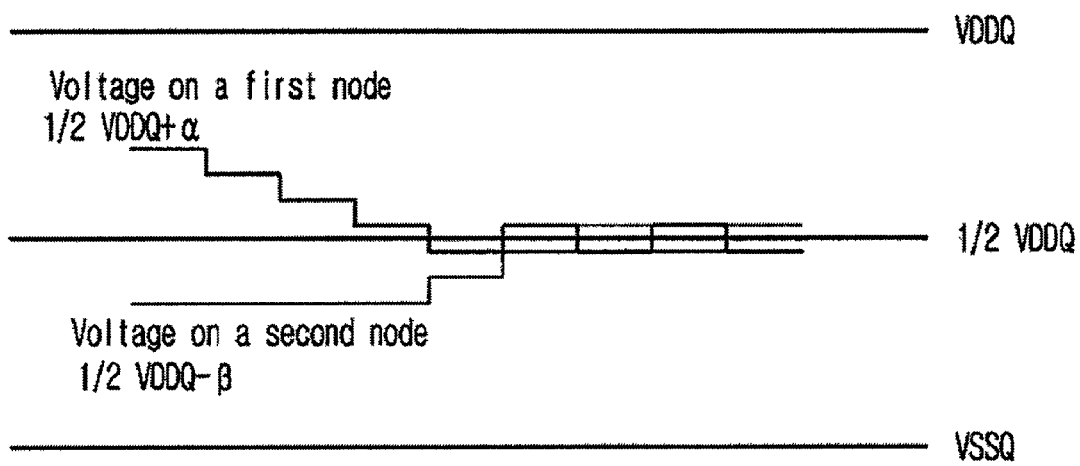
FIG. 2 is a graph depicting a voltage level changed by a pull-up/down calibration.
Figure 3:
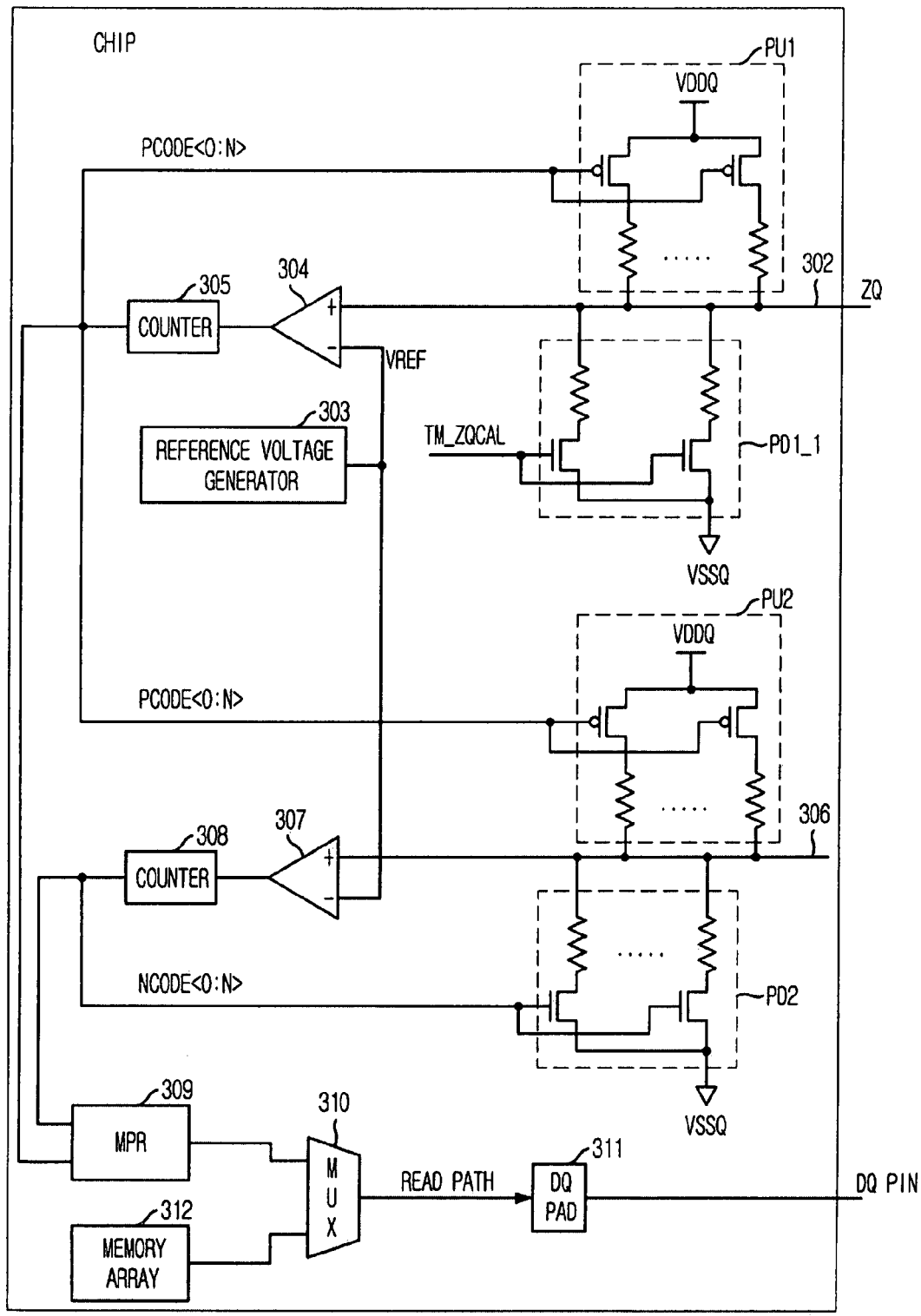
FIG. 3 is a block diagram illustrating an impedance matching circuit in accordance with an embodiment of the present invention.

FIG. 3 is a block diagram illustrating an impedance matching circuit in accordance with an embodiment of the present invention. The impedance matching circuit includes a first pull-down resistor PD1_1, a first pull-up resistor PU1, a second pull-up resistor PU2 and a second pull-down resistor PD2.

As compared with a conventional impedance matching circuit, the impedance matching circuit of the present invention further includes the first pull-down resistor PD1_1. The first pull-down resistor PD1_1 operates as an external resistor. Accordingly, the impedance matching circuit can perform ZQ calibration to test a wafer state.

The first pull down resistor PD1_1 supplies a ground voltage VSSQ to a first node 302, i.e., a pad ZQ, in response to a calibration test signal TM_ZQCAL. When the calibration test signal TM_ZQCAL is inputted, the first pull-down resistor PD1_1 turns on and operates as an external resistor. Accordingly the impedance matching circuit can perform a ZQ calibration and the ZQ calibration can be tested. When no calibration test signal TM_ZQCAL is inputted, the first pull-down resistor turns off. The impedance matching circuit operates the same as a conventional impedance matching circuit does.

The first pull-down resistor PD1_1 includes two resistor-connected NMOS transistor. When the calibration test signal TM_ZQCAL is inputted at a high level, two NMOS transistors turn on and two resistors operate. On the other hand, when the calibration test signal TM_ZQCAL is inputted at a low level, two NMOS transistors turn off and two resistors do not operate. The first pull-down resistor may include a plurality of resistor-connected NMOS transistor. When the calibration test signal TM_ZQCAL is inputted, all of the NMOS transistors turn on. When no calibration test signal TM_ZQCAL is inputted, all of the NMOS transistors turn off.

The calibration test signal TM_ZQCAL is a signal for a test mode, which is enabled when an impedance matching circuit of a semiconductor memory device tests a wafer state. The calibration test signal TM_ZQCAL may be inputted to the impedance matching circuit in many manners such as an input pad provided additionally and MRS setting.

The first pull-up resistor PU1 supplies a supply voltage VDDQ to the first node 302 in response to a pull-up calibration code PCODE<0:N>. At the test mode, resistance of the first pull-up resistor PU1 is calibrated to be identical to resistance of the first pull-down resistor PD1_1 substituted for an external resistor The second pull-up resistor PU2 supplies the supply voltage VDDQ to the second node 306 in response to the pull-up calibration code PCODE<0:N>. The pull-up calibration code PCODE<0:N> makes resistance of the second pull-up resistor PU2 identical to that of the first pull-up resistor PU1.

The second pull-down resistor PD2 supplies the ground voltage VSSQ to the second node 306 in response to a pull-down calibration code NCODE<0:N>. Resistance of the second pull-down resistor PD2 is calibrated to be identical to resistance of the second pull-up resistor PU2.

The first pull-up resistor PU1, the second pull-up resistor PU2 and the second pull-down resistor PD2 include a plurality of resistor-connected MOS transistors in parallel respectively. The MOS transistors turn on or off according to each control code and make the resistors operate. Whole resistance can be controlled according to each control code.

In order to test a calibration operation, the pull-up and pull-down calibration codes PCODE<0:N> and NCODE<0:N> are outputted and checked. Otherwise, the calibration operation can be tested by checking only the pull-down calibration code NCODE<0:N> because the pull-down calibration code NCODE<0:N> is lastly generated in the calibration operation.

The pull-up and pull-down calibration codes PCODE<0:N> and NCODE<0:N> may be outputted in many manners. As shown in FIG. 3, the pull-up and pull-down calibration codes PCODE<0:N> and NCODE<0:N> are inputted into a multi purpose register (MPR) 309. Through a multiplexer (MUX) 310 and data read path, the pull-up and pull-down calibration codes PCODE<0:N> and NCODE<0:N> can be checked from a data pad (DQ PAD) 311.

In order to test the calibration, first of all, the calibration test signal TM_ZQCAL is inputted. The first pull-down resistor PD1_1 turns on in response to the calibration test signal TM_ZQCAL. The resistance of the first pull-up resistor PU1 is calibrated to be identical to that of the first pull-down resistor PD1_1. The pull-up calibration code PCODE<0:N> is generated and inputted into the second pull-up resistor PU2, determining the resistance of the second pull-up resistor PU2. The resistance of the second pull-down resistor PD2 is calibrated to be identical to that of the second pull-up resistor PU2. The pull-down calibration code NCODE<0:N> is generated. Finally, by outputting and checking the pull-down calibration code NCODE<0:N>, the ZQ calibration operation of an impedance matching circuit can be tested.

Figure 4:
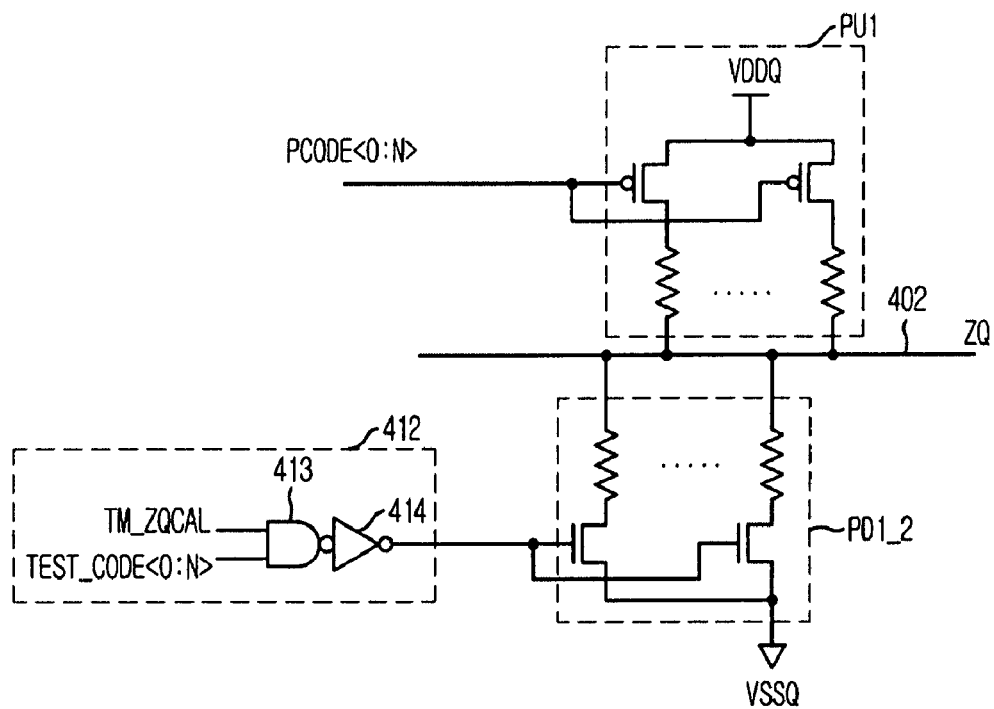
FIG. 4 is a block diagram illustrating an impedance matching circuit in accordance with another embodiment of the present invention.
Figure 4:
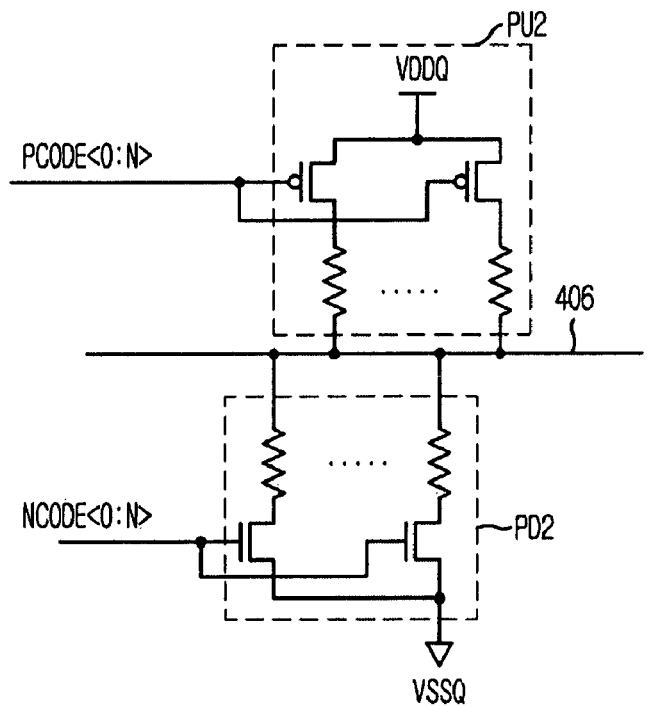

FIG. 4 is a block diagram showing an impedance matching circuit in accordance with another embodiment of the present invention. A part of circuits overlapped with those described in FIG. 3 are omitted.

As compared with the impedance matching circuit described in FIG. 3, an input unit 412 is further included in FIG. 4. The input unit 412 is provided to receive a test calibration code TEST_CODE<0:N> when a calibration test signal TM_ZQCAL is inputted, i.e., at a test mode of the impedance matching circuit. The input unit 412 includes a NAND gate 413 for receiving the calibration test signal TM_ZQCAL and the test calibration code TEST_CODE<0:N> and an inverter 414 for inverting an output of the NAND gate 413.

When the calibration test signal TM_ZQCAL is inputted at a low level, the NAND gate 413 outputs a high level of signal and an output of the inverter 414 becomes a low level. Accordingly, all NMOS transistors of a first pull-down resistor PD1_2 turn off. However, when the calibration test signal TM_ZQCL is inputted at a high level, the output of the inverter 414 has an identical level to the test calibration code TEST_CODE<0:N>. In the test mode, the test calibration code TEST_CODE<0:N> is inputted into the first pull-down resistor PD1_2 through the input unit 412.

The first pull-down resistor PD1_2 is able to control its resistance according to the test calibration code TEST_CODE<0:N>. Accordingly, it is possible to test calibration operations according to a variety of resistance.

By checking a pull-down calibration code NCODE<0:N>, it is confirmed whether the calibration operation is performed rightly. That is, comparing the test calibration code TEST_CODE<0:N> inputted at the test mode with the pull-down calibration code NCODE<0:N>, it can be confirmed whether the calibration operation is performed rightly A method for testing a ZQ calibration operation performed by the above impedance matching circuit is described below.

Resistance of the first pull-down resistor PD1_2 is determined according to the test calibration code TEST_CODE<0:N> inputted at the test mode. Resistance of a first pull-up resistor PU1 is calibrated to be identical to that of the first pull-down resistor PD1_2. A pull-up calibration code PCODE<0:N> is generated and inputted into a second pull-up resistor PU2, determining resistance of the second pull-up resistor PU2. Resistance of a second pull-down resistor PD2 is calibrated to be identical to that of the second pull-up resistor PU2. The pull-down calibration code NCODE<0:N> is generated. Finally, by checking the pull-down calibration code NCODE<0:N>, the ZQ calibration operation of the impedance matching circuit can be tested.

While the present invention has been described with respect to the particular embodiments, it will be apparent to those skilled in the art that various changes and modifications may be made without departing from the spirit and scope of the invention as defined in the following claims.

What is claimed is:

1. An impedance matching circuit of a semiconductor memory device, comprising:
   an input unit for receiving a test calibration code;
   a test resistance unit for supplying a ground voltage to a first node and having resistance determined according to the test calibration code;
   a first pull-up resistance unit for supplying a supply voltage to the first node and for calibrating its resistance to that of the test resistance unit in response to a pull-up calibration code;
   a second pull-up resistance unit for supplying the supply voltage to a second node in response to the pull-up calibration code; and
   a pull-down resistance unit for supplying the ground voltage to the second node for calibrating its resistance to that of the second pull-up resistance unit in response to a pull-down calibration code,
   wherein the input unit includes:
   a logic gate for performing a NAND operation on a calibration test signal and the test calibration code; and
   an inverter for inverting an output of the logic gate.

2. The impedance matching circuit of claim 1, wherein the input unit inputs the test calibration code into the test resistance unit when the calibration test signal is enabled and does not input the test calibration code into the test resistance unit when the calibration test signal is disabled.

3. The impedance matching circuit of claim 1, wherein each of the first pull-up resistance unit, the test resistance unit, the second pull-up resistance unit and the pull-down resistance unit includes;
   a plurality of resistors connected in parallel; and
   a plurality of MOS transistors turning on/off according to respective calibration codes to thereby control resistance of the plurality of resistors.

4. A semiconductor memory device capable of testing the ZQ calibration of an impedance matching circuit without connecting an external resistor, comprising:
   a test resistance unit for supplying a ground voltage to a first node and having resistance determined according to a test calibration code;
   a first pull-up resistance unit for supplying a supply voltage to the first node and for calibrating its resistance to that of the test resistance unit in response to a pull-up calibration code;

a second pull-up resistance unit for supplying the supply voltage to a second node in response to the pull-up calibration code; and a pull-down resistance unit for supplying the ground voltage to the second node for calibrating its resistance to that of the second pull-up resistance unit in response to a pull-down calibration code, wherein the first and second nodes are different nodes.

5. The semiconductor memory device of claim 4, wherein each of the first pull-up resistance unit, the test resistance unit, the second pull-up resistance unit and the pull-down resistance unit includes;

a plurality of resistors connected in parallel; and a plurality of MOS transistors turning on/off according to respective calibration codes to thereby control resistance of the plurality of resistors.

6. A method for testing a ZQ calibration of an impedance matching circuit without connecting an external resistor, comprising:

determining resistance of a test resistance unit by inputting a test calibration code;

generating a pull-up calibration code by supplying a first node with a supply voltage and calibrating resistance of a first pull-up resistance unit to that of the test resistance unit;

inputting the pull-up calibration code to a second pull-up resistance unit;

generating a pull-down calibration code by supplying a second node with a ground voltage and calibrating resistance of a pull-down resistance unit to that of the second pull-up resistance unit; and outputting the pull-down calibration code, wherein the first and second nodes are different nodes.

7. The method for testing the ZQ calibration of claim 6, wherein the test calibration code is inputted when a calibration test signal is enabled.

8. The impedance matching circuit of claim 4, wherein the test calibration code is inputted when a calibration test signal is enabled.

* * * * *